United States Patent
Komatsu et al.

(10) Patent No.: US 11,578,230 B2
(45) Date of Patent: Feb. 14, 2023

(54) COMPOSITION, POLYMER, AND METHOD OF PRODUCING SUBSTRATE

(71) Applicant: JSR CORPORATION, Tokyo (JP)

(72) Inventors: Hiroyuki Komatsu, Tokyo (JP); Miki Tamada, Tokyo (JP); Ryo Kumegawa, Tokyo (JP); Tatsuya Sakai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 93 days.

(21) Appl. No.: 17/196,006

(22) Filed: Mar. 9, 2021

(65) Prior Publication Data

US 2021/0189553 A1 Jun. 24, 2021

Related U.S. Application Data

(63) Continuation of application No. PCT/JP2019/038636, filed on Sep. 30, 2019.

(30) Foreign Application Priority Data

Oct. 3, 2018 (JP) .............................. JP2018-188640

(51) Int. Cl.

| B05D 1/00 | (2006.01) |
|---|---|
| C09D 125/16 | (2006.01) |
| C23C 18/00 | (2006.01) |
| C08F 212/08 | (2006.01) |
| C08F 212/12 | (2006.01) |
| C08L 101/02 | (2006.01) |
| C23C 18/18 | (2006.01) |
| B05D 3/02 | (2006.01) |
| H01L 23/14 | (2006.01) |
| B05D 7/24 | (2006.01) |

(52) U.S. Cl.

CPC ........... C09D 125/16 (2013.01); B05D 1/005 (2013.01); C08F 212/08 (2013.01); C08F 212/12 (2013.01); C08L 101/02 (2013.01); C23C 18/00 (2013.01); C23C 18/18 (2013.01); *B05D 3/0272* (2013.01); *B05D 7/24* (2013.01); *B05D 2202/40* (2013.01); *B05D 2202/45* (2013.01); *B05D 2203/30* (2013.01); *B05D 2401/10* (2013.01); *H01L 23/145* (2013.01)

(58) Field of Classification Search

None

See application file for complete search history.

(56) References Cited

U.S. PATENT DOCUMENTS

2010/0323174 A1* 12/2010 Nagasaki ................ C23C 18/30
428/209
2013/0295287 A1* 11/2013 Tsukamoto ............. B32B 15/08
524/554

FOREIGN PATENT DOCUMENTS

| JP | 20030760364 | | 3/2003 | |
|---|---|---|---|---|
| JP | 2008104909 | A | 5/2008 | |
| JP | 2009263703 | A * | 11/2009 | |
| JP | 2009263703 | A | 11/2009 | |
| JP | 2012144761 | A | 8/2012 | |
| JP | 2016025315 | A | 2/2016 | |
| WO | WO-2008050631 | A1 * | 5/2008 | ............. B05D 5/067 |
| WO | WO-2012046615 | A1 * | 4/2012 | ......... C23C 18/1603 |
| WO | WO-2012046615 | A1 | 4/2012 | |

OTHER PUBLICATIONS

Atsushi Hozumi et al, "Preparation of a Well-Defined Amino-Terminated Self-Assembled Monolayer and Copper Microlines on a Polyimide Substrate Covered with an Oxide Nanoskin", Langmuir, vol. 21, No. 18, 2005, pp. 8234-8242.

Fatemeh Sadat Minaye Hashemi et al, "Self-Correcting Process for High Quality Patterning by Atomic Layer Deposition", ACS NANO, vol. 9, No. 9, 2015, pp. 8710-8717.

Haeshin Lee et al, "Mussel-Inspired Surface Chemistry for Multifunctional Coatings", Science, 318 (5849), Oct. 19, 2007, pp. 426-430.

International Search Report dated Oct. 29, 2019 in PCT/JP2019/038636 (with English translation), 5 pages.

Ming Fang et al, "Area-Selective Atomic Layer Deposition: Conformal Coating, Subnanometer Thickness Control, and Smart Positioning", ACS NANO, vol. 9, No. 9, 2015, pp. 8651-8654.

Written Opinion dated Oct. 29, 2019 inPCT/JP2019/038636 (with English translation), 11 pages.

Office Action dated Jul. 19, 2022 in Japanese Patent Application No. 2020-550435 (with English translation), 8 pages.

* cited by examiner

*Primary Examiner* — Jose I Hernandez-Kenney

(74) *Attorney, Agent, or Firm* — Element IP, PLC

(57) ABSTRACT

A method of producing a substrate includes: applying a composition on a metal basal plate to form a coating film; and forming a metal-containing layer on at least a part of the coating film. The composition contains a solvent, and a polymer having a first terminal structure and a second terminal structure in a single molecule. Each of the first terminal structure and the second terminal structure is at least one selected from the group consisting of a structure represented by formula (1) and a structure represented by formula (2). $A^1$ and $A^2$ each independently represent a monovalent group having a functional group capable of forming a chemical bond with a metal atom. $L^2$ represents —S—, —NR—, or —NA$^{22}$-, wherein A$^{22}$ represents a monovalent group having a functional group capable of forming a chemical bond with a metal atom.

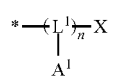

(1)

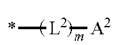

(2)

20 Claims, No Drawings

COMPOSITION, POLYMER, AND METHOD OF PRODUCING SUBSTRATE

CROSS-REFERENCE TO RELATED APPLICATIONS

The present application is a continuation application of International Application No. PCT/JP2019/038636, filed Sep. 30, 2019, which claims priority to Japanese Patent Application No. 2018-188640 filed Oct. 3, 2018. The contents of these applications are incorporated herein by reference in their entirety.

BACKGROUND OF THE INVENTION

Field of the Invention

The present invention relates to a composition, a polymer, and a method of producing a substrate.

DISCUSSION OF THE BACKGROUND

In manufacture and the like of a semiconductor device, various layers are formed on a surface of a metal basal plate. As a method of forming such a layer, for example, investigations have come to be conducted regarding a method of selectively modifying a substrate having fine regions on a surface layer thereof. For such a modification method, a material that enables convenient surface region modification is needed, and various types of materials have been investigated (see, Japanese Unexamined Patent Application, Publication No. 2016-25315; Japanese Unexamined Patent Application, Publication No. 2003-76036; ACS Nano, 9, 9, 8710, 2015; ACS Nano, 9, 9, 8651, 2015; Science, 318, 426, 2007; and Langmuir, 21, 8234, 2005).

SUMMARY OF THE INVENTION

According to an aspect of the present invention, a method of producing a substrate includes applying a composition on a metal basal plate to form a coating film. A metal-containing layer is formed on at least a part of the coating film. The composition includes a solvent, and a polymer including a first terminal structure and a second terminal structure in a single molecule. Each of the first terminal structure and the second terminal structure is at least one selected from the group consisting of a structure represented by formula (1) and a structure represented by formula (2).

In the formula (1), $L^1$ represents a trivalent group having 1 to 20 carbon atoms; $A^1$ represents a monovalent group including a functional group capable of forming a chemical bond with a metal atom; X represents a hydrogen atom, —SH, —S-$A^{11}$, or a monovalent organic group having 1 to 20 carbon atoms, wherein $A^{11}$ represents a monovalent group including a functional group capable of forming a chemical bond with a metal atom; n denotes a number of structural units constituting a block represented by (-$L^1$(-$A^1$)-)$_n$, and is an integer of no less than 2, wherein a plurality of $A^1$s are identical or different, and $A^1$ and $A^{11}$ are identical or different; and * denotes a site bonding to a part other than the structure represented by the formula (1) in the polymer. In the formula (2), $L^2$ represents —S—, —NR—, or —N$A^{22}$-, wherein R represents a hydrogen atom or a monovalent hydrocarbon group having 1 to 20 carbon atoms, and $A^{22}$ represents a monovalent group including a functional group capable of forming a chemical bond with a metal atom; $A^2$ represents a monovalent group including a functional group capable of forming a chemical bond with a metal atom, and $A^2$ and $A^{22}$ are identical or different; m is 0 or 1; and * denotes a site bonding to a part other than the structure represented by the formula (2) in the polymer.

According to another aspect of the present invention, a composition includes: a solvent, and a polymer including a first terminal structure and a second terminal structure in a single molecule. Each of the first terminal structure and the second terminal structure is at least one selected from the group consisting of a structure represented by formula (1) and a structure represented by formula (2).

In the formula (1), $L^1$ represents a trivalent group having 1 to 20 carbon atoms; $A^1$ represents a monovalent group including a functional group capable of forming a chemical bond with a metal atom; X represents a hydrogen atom, —SH, —S-$A^{11}$, or a monovalent organic group having 1 to 20 carbon atoms, wherein $A^{11}$ represents a monovalent group including a functional group capable of forming a chemical bond with a metal atom; n denotes a number of structural units constituting a block represented by (-$L^1$(-$A^1$)-)$_n$, and is an integer of no less than 2, wherein a plurality of $A^1$s are identical or different, and $A^1$ and $A^{11}$ are identical or different; and * denotes a site bonding to a part other than the structure represented by the formula (1) in the polymer. In the formula (2), $L^2$ represents —S—, —NR—, or —N$A^{22}$-, wherein R represents a hydrogen atom or a monovalent hydrocarbon group having 1 to 20 carbon atoms, and $A^{22}$ represents a monovalent group including a functional group capable of forming a chemical bond with a metal atom; $A^2$ represents a monovalent group including a functional group capable of forming a chemical bond with a metal atom, and $A^2$ and $A^{22}$ are identical or different; m is 0 or 1; and * denotes a site bonding to a part other than the structure represented by the formula (2) in the polymer.

According to a further aspect of the present invention, a polymer includes a first terminal structure and a second terminal structure in a single molecule. Each of the first terminal structure and the second terminal structure is at least one selected from the group consisting of a structure represented by formula (1) and a structure represented by formula (2).

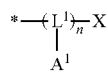

(1)

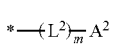

(2)

In the formula (1), $L^1$ represents a trivalent group having 1 to 20 carbon atoms; $A^1$ represents a monovalent group including a functional group capable of forming a chemical bond with a metal atom; X represents a hydrogen atom, —SH, —S-$A^{11}$, or a monovalent organic group having 1 to 20 carbon atoms, wherein $A^{11}$ represents a monovalent group including a functional group capable of forming a chemical bond with a metal atom; n denotes a number of structural units constituting a block represented by $(-L^1(-A^1)-)_n$, and is an integer of no less than 2, wherein a plurality of $A^1$s are identical or different, and $A^1$ and $A^{11}$ are identical or different; and * denotes a site bonding to a part other than the structure represented by the formula (1) in the polymer. In the formula (2), $L^2$ represents —S—, —NR—, or —N$A^{22}$-, wherein R represents a hydrogen atom or a monovalent hydrocarbon group having 1 to 20 carbon atoms, and $A^{22}$ represents a monovalent group including a functional group capable of forming a chemical bond with a metal atom; $A^2$ represents a monovalent group including a functional group capable of forming a chemical bond with a metal atom, and $A^2$ and $A^{22}$ are identical or different; m is 0 or 1; and * denotes a site bonding to a part other than the structure represented by the formula (2) in the polymer.

DESCRIPTION OF EMBODIMENTS

Recently, as a layer to be formed on a surface of a metal basal plate, a metal-containing layer containing a metal atom has been required to be formed. However, in the case of the above-mentioned conventional materials, forming of the metal-containing layer is difficult.

One embodiment of the invention is a method of producing a substrate, the method including:

applying a composition on a metal basal plate to form a coating film; and forming a metal-containing layer on at least a part of the coating film, wherein the composition contains a solvent, and a polymer having a first terminal structure and a second terminal structure in a single molecule, wherein each of the first terminal structure and the second terminal structure is at least one selected from the group consisting of a structure represented by the following formula (1) and a structure represented by the following formula (2),

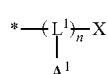

(1)

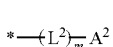

(2)

wherein, in the above formula (1), $L^1$ represents a trivalent group having 1 to 20 carbon atoms; $A^1$ represents a monovalent group having a functional group capable of forming a chemical bond with a metal atom; X represents a hydrogen atom, —SH, —S-$A^{11}$, or a monovalent organic group having 1 to 20 carbon atoms, wherein $A^{11}$ represents a monovalent group having a functional group capable of forming a chemical bond with a metal atom; n denotes a number of structural units constituting a block represented by $(-L^1(-A^1)-)_n$, and is an integer of no less than 2, wherein a plurality of $A^1$s may be identical or different, and $A^1$ and $A^{11}$ may be identical or different; and * denotes a site bonding to a part other than the structure represented by the formula (1) in the polymer, and in the formula (2), $L^2$ represents —S—, —NR—, or —N$A^{22}$-, wherein R represents a hydrogen atom or a monovalent hydrocarbon group having 1 to 20 carbon atoms, and $A^{22}$ represents a monovalent group having a functional group capable of forming a chemical bond with a metal atom; $A^2$ represents a monovalent group having a functional group capable of forming a chemical bond with a metal atom, and $A^2$ and $A^{22}$ are identical or different; m is 0 or 1; and * denotes a site bonding to a part other than the structure represented by the formula (2) in the polymer.

Another embodiment of the invention is a composition to be used in a method of producing a substrate, the substrate including a metal basal plate and a metal-containing layer formed on the metal basal plate, the composition containing:

a solvent, and a polymer having a first terminal structure and a second terminal structure in a single molecule, wherein each of the first terminal structure and the second terminal structure is at least one selected from the group consisting of a structure represented by the above formula (1) and a structure represented by the above formula (2).

Yet another embodiment of the invention is a polymer which has a first terminal structure and a second terminal structure in a single molecule, each of the first terminal structure and the second terminal structure being at least one selected from the group consisting of a structure represented by the above formula (1) and a structure represented by the above formula (2).

As referred to herein, the "metal basal plate" refers to a basal plate containing a metal atom in at least a part of a surface layer thereof.

According to the method of producing a substrate of the one embodiment of the present invention, a substrate in which the metal-containing layer is formed on the surface of the metal basal plate can be conveniently produced. The composition of the other embodiment of the present invention can be suitably used in the method of producing a substrate of the one embodiment of the present invention. The polymer of the yet another embodiment of the present invention can be suitably used as a polymer component of the composition of the other embodiment of the present invention. Therefore, these can be suitably used in manufacturing processes of semiconductor devices, in which further progress of miniaturization is expected in the future.

Hereinafter, an embodiment of the method of producing a substrate of the present invention is explained in detail.

Method of Producing Substrate

According to one embodiment of the present invention, a method of producing a substrate includes a step (hereinafter, may be also referred to as "applying step") of applying a composition (hereinafter, may be also referred to as "composition (S)") on at least an upper face of a metal basal plate (hereinafter, may be also referred to as "metal basal plate (X)") to form a coating film (hereinafter, may be also referred to as "coating film (P)"); and a step (hereinafter, may be also referred to as "metal-containing layer-forming step") of forming a metal-containing layer (hereinafter, may be also referred to as "metal containing layer (Y)") on at least a part of an upper face of the coating film (P). With regard to the method of producing a substrate, as the composition (S), a composition containing a solvent (hereinafter, may be also referred to as "(B) solvent" or "solvent (B)", and a polymer (hereinafter, may be also referred to as "(A) polymer" or "polymer (A)") having a first terminal structure (hereinafter, may be also referred to as "terminal structure (I)") and a second terminal structure (hereinafter, may be also referred to as "terminal structure (II)") in a single molecule is used, wherein each of the terminal structure (I) and the terminal structure (II) is at least one selected from the group consisting of a structure represented by the following formula (1) (hereinafter, may be also referred to as "structure (1)") and a structure represented by the following formula (2) (hereinafter, may be also referred to as "structure (2)").

In the above formula (1), $L^1$ represents a trivalent group having 1 to 20 carbon atoms; $A^1$ represents a monovalent group having a functional group capable of forming a chemical bond with a metal atom; X represents a hydrogen atom, —SH, —S-$A^{11}$, or a monovalent organic group having 1 to 20 carbon atoms, wherein $A^{11}$ represents a monovalent group having a functional group capable of forming a chemical bond with a metal atom; n denotes a number of structural units constituting a block represented by (-$L^1$(-$A^1$)-)$_n$, and is an integer of no less than 2, wherein a plurality of $A^1$s may be identical or different, and $A^1$ and $A^{11}$ may be identical or different; and * denotes a site bonding to a part other than the structure represented by the formula (1) in the polymer.

In the above formula (2), $L^2$ represents —S—, —NR—, or —N$A^{22}$-, wherein R represents a hydrogen atom or a monovalent hydrocarbon group having 1 to 20 carbon atoms, and $A^{22}$ represents a monovalent group having a functional group capable of forming a chemical bond with a metal atom; $A^2$ represents a monovalent group having a functional group capable of forming a chemical bond with a metal atom, and $A^2$ and $A^{22}$ may be identical or different; m is 0 or 1; and * denotes a site bonding to a part other than the structure represented by the formula (2) in the polymer (A).

According to the method of producing a substrate, the substrate including both the metal basal plate (X) and the metal-containing layer (Y) formed on at least the upper face of the metal basal plate (X) is produced. According to the method of producing a substrate, due to including each of the aforementioned steps, and the composition (S) containing the polymer (A), the substrate in which the metal-containing layer is formed on the surface of the metal basal plate can be conveniently produced. Although not necessarily clarified and without wishing to be bound by any theory, the reason for achieving the aforementioned effects by the method of producing a substrate due to involving such a constitution may be presumed, for example, as in the following. The polymer (A) contains, at both ends thereof, a terminal structure having a functional group capable of forming a chemical bond with a metal atom. Due to applying the composition (S) on the surface of the metal basal plate, the polymer (A) is arranged on the surface of the metal basal plate (X) due to formation of a chemical bond between a metal atom in the metal basal plate (X), and the functional group which is capable of forming a chemical bond with a metal atom and is contained in one of the terminal structures of the polymer (A). By using the functional group which is capable of forming a chemical bond with a metal atom and is contained in the other terminal structure of the polymer (A), the metal-containing layer can be easily formed. According to the method of producing a substrate, the substrate in which the metal-containing layer is formed on the surface of the metal basal plate can thus be conveniently produced.

Hereinafter, each step will be described.

Applying Step

In this step, the composition (S) is applied on at least the upper face of the metal basal plate (X).

The metal atom contained in the metal basal plate (X) (hereinafter, may be also referred to as "metal atom (A)") is not particularly limited as long as it is an atom of a metal element. Atoms of silicon and boron do not fall under the category of the metal atom (A). Examples of the metal atom (A) include atoms of copper, iron, zinc, cobalt, aluminum, tin, tungsten, zirconium, titanium, tantalum, germanium, molybdenum, ruthenium, gold, silver, platinum, palladium, nickel, and the like. Of these, an atom of copper or cobalt is preferred.

The metal atom (A) may be contained in the metal basal plate (X) in a form of, for example, a metal simple substance, an alloy, a metal nitride, a metal oxide, a silicide, or the like.

Examples of the metal simple substance include simple substances of metals such as copper, cobalt, aluminum, and tungsten, and the like.

Examples of the alloy include a nickel-copper alloy, a cobalt-nickel alloy, a gold-silver alloy, and the like.

Examples of the metal nitride include titanium nitride, tantalum nitride, iron nitride, aluminum nitride, and the like.

Examples of the metal oxide include tantalum oxide, aluminum oxide, iron oxide, copper oxide, and the like.

Examples of the silicide include iron silicide, molybdenum silicide, and the like.

Of these, the metal simple substance is preferred, and a simple substance of copper or cobalt is more preferred.

In the surface layer of the metal basal plate (X), aside from a region (hereinafter, may be also referred to as "region (I)") containing the metal atom (A), for example, a region (hereinafter, may be also referred to as "region (II)") constituted substantially only from a nonmetal atom (hereinafter, may be also referred to as "nonmetal atom (C)"), and the like may also be contained. Examples of the nonmetal atom (C) include atoms of silicon, boron, carbon, oxygen, nitrogen, hydrogen, and the like.

The nonmetal atom (C) may be contained in the region (II) in a form of, for example, a nonmetal simple substance, a nonmetal oxide, a nonmetal nitride, a nonmetal oxynitride, a nonmetal carboxide, or the like.

Examples of the nonmetal simple substance include simple substances of nonmetals such as silicon, boron, and carbon, and the like.

Examples of the nonmetal oxide include: silicon dioxide ($SiO_2$); hydrolytic condensation products of hydrolyzable silane such as tetraalkoxysilane, e.g., tetraethoxysilane (TEOS); boron oxide; and the like.

Examples of the nonmetal nitride include silicon nitride, boron nitride, and the like.

Examples of the nonmetal oxynitride include silicon oxynitride, boron oxynitride, and the like.

Examples of the nonmetal carboxide include silicon oxycarbide (SiOC), and the like.

In the case in which the metal basal plate (X) contains both the region (I) and the region (II), a mode of arrangement of the region (I) and the region (II) on the surface layer of the metal basal plate (X) is not particularly limited, and is exemplified by shapes being platy, spotted, striped, or the like in planar view. The size of each of the region (I) and the region (II) is not particularly limited, and the regions may have an appropriate desired size.

The shape of the metal basal plate (X) is not particularly limited, and may be made into a desired shape such as a plate shape (basal plate) or a spherical shape, as appropriate.

It is preferred that the surface of the metal basal plate (X) is washed beforehand with, for example, an about 5% by mass aqueous oxalic acid solution.

An application procedure of the composition (S) may be, for example, spin coating or the like. Heating may be conducted after the applying. The lower limit of a temperature of the heating is preferably 50° C., and more preferably 80° C. The upper limit of the temperature is preferably 200° C., and more preferably 150° C. The lower limit of a time period of the heating is preferably 10 sec, and more preferably 30 sec. The upper limit of the time period is preferably 1 hour, and more preferably 10 min. After the heating, the polymer (A) which has not chemically bonded to the surface of the metal basal plate (X) is preferably washed away using a solvent such as polypropylene glycol monomethyl ether acetate (PGMEA) and removed. The coating film (P) is thus formed.

The lower limit of a contact angle of water on a surface of the coating film (P) is preferably 70°, more preferably 80°, and still more preferably 85°. The upper limit of the contact angle is, for example, 100°.

The composition (S) is described below.

Composition (S)

The composition (S) is to be used in a method of producing a substrate including: the metal basal plate (X); and the metal-containing layer (Y) formed on at least the upper face of the metal basal plate (X). The composition (S) contains the polymer (A) and the solvent (B). In addition to the polymer (A) and the solvent (B), the composition (S) may also contain, within a range not leading to impairment of the effects of the present invention, other component(s). Hereinafter, each component will be described.

(A) Polymer

The polymer (A) has the terminal structure (I) and the terminal structure (II) in a single molecule. The polymer (A) typically has, between the terminal structure (I) and the terminal structure (II), a structural unit (hereinafter, may be also referred to as "structural unit (A)") derived from a monomer (hereinafter, may be also referred to as "monomer (a)").

Terminal Structures

Each of the terminal structure (I) and the terminal structure (II) is at least one selected from the group consisting of the structure (1) and the structure (2).

In the structure (1), $A^1$ in the above formula (1), and $A^{11}$ in the case in which X in the above formula (1) is —S-$A^{11}$; and in the structure (2), $A^2$ in the above formula (2), and $A^{22}$ in the case in which $L^2$ in the above formula (2) is —N$A^{22}$- each represent a monovalent group (hereinafter, may be also referred to as "group (I)") having a functional group (hereinafter, may be also referred to as "functional group (M)") capable of forming a chemical bond with a metal atom.

The functional group (M) is capable of forming a chemical bond with a metal atom. Metal atoms capable of forming a chemical bond with the functional group (M) are exemplified by the metal atom (A) contained in the metal basal plate (X), a metal atom (a second metal atom; hereinafter, may be also referred to as "metal atom (B)") contained in the metal-containing layer (Y), described later, and the like. The chemical bond between the metal atom and the functional group (M) is exemplified by a covalent bond, an ionic bond, a coordinate bond, and the like. Of these, in light of bonding strength between the metal atom and the functional group (M) being more intense, the chemical bond is preferably a coordinate bond.

The functional group (M) is exemplified by a phosphoric acid group, a nitrile group, a carboxy group, an ester group, a hydroxy group, and the like. The "phosphoric acid group" as referred to herein means a group represented by —PO(OH)$_2$. The "ester group" as referred to herein means a group represented by —COOR (wherein R represents a monovalent organic group).

The group (I) is exemplified by a group (hereinafter, may be also referred to as "group (i)") represented by the following formula (i), and the like.

(i)

In the above formula (i), E represents a single bond, —COO—, —CO—, —O—, —NH—, —NHCO—, or —CONH—; Q represents a single bond or a divalent hydrocarbon group having 1 to 20 carbon atoms; $R^1$ represents a monovalent functional group (M); p is an integer of 0 to 10, wherein in a case in which p is no less than 1, there is no case in which Q represents a single bond; and * denotes a site bonding to $L^1$ in the above formula (1).

E represents preferably a single bond or —COO—, and more preferably a single bond.

Examples of the divalent hydrocarbon group having 1 to 20 carbon atoms which may be represented by Q include an alkanediyl group, a cycloalkanediyl group, an arenediyl group, an arenediylalkanediyl group, and the like.

Q represents preferably a single bond or an alkanediyl group, and more preferably a single bond.

Examples of the monovalent functional group (M) represented by $R^1$ include monovalent groups of the groups exemplified above as the functional group (M), and the like.

p is preferably 0 to 2, more preferably 0 or 1, and still more preferably 0.

The group (i) is preferably a phosphoric acid group, a cyanoalkyl group, a carboxy group, a carboxyalkyl group, an ester group, a hydroxy group, or a hydroxyalkyl group. Examples of the cyanoalkyl group include a 1-cyano-1-methylethyl group and the like. Examples of the carboxyalkyl group include a 2-carboxyethyl group and the like. Examples of the ester group include a methoxycarbonyl group and the like. Examples of the hydroxyalkyl group include a 2-hydroxyethyl group and the like.

$A^1$ in the above formula (1) represents preferably the phosphoric acid group. Moreover, $A^2$ in the above formula (2) represents preferably at least one selected from the group consisting of a nitrile group, a carboxy group, an ester group, and a hydroxy group.

$L^1$ in the above formula (1) represents a group constituting a part of a main chain of the polymer (A). The "main chain" as referred to herein means the longest atomic chain among atomic chains of the polymer (A). The trivalent group having 1 to 20 carbon atoms represented by $L^1$ is exemplified by a group derived from a group having a carbon-carbon double bond, a group derived from an oxyalkylene group, and the like.

The monovalent organic group having 1 to 20 carbon atoms which may be represented by X in the above formula (1) is exemplified by: a monovalent hydrocarbon group having 1 to 20 carbon atoms; a group that includes a divalent hetero atom-containing group between two adjacent carbon atoms of the monovalent hydrocarbon group having 1 to 20 carbon atoms; a group obtained by substituting with a monovalent hetero atom-containing group, a part or all of hydrogen atoms included in the monovalent hydrocarbon group having 1 to 20 carbon atoms or the divalent hetero atom-containing group; and the like. The "organic group" as referred to herein means a group that includes at least one carbon atom.

The "hydrocarbon group" as referred to herein may include a chain hydrocarbon group, an alicyclic hydrocarbon group, and an aromatic hydrocarbon group. The "hydrocarbon group" may be either a saturated hydrocarbon group or an unsaturated hydrocarbon group. The "chain hydrocarbon group" as referred to herein means a hydrocarbon group not including a cyclic structure but being constituted with only a chain structure, and both a linear hydrocarbon group and a branched hydrocarbon group may be included. The "alicyclic hydrocarbon group" as referred to herein means a hydrocarbon group that includes, as a ring structure, not an aromatic ring structure but an alicyclic structure alone, and may include both a monocyclic alicyclic hydrocarbon group and a polycyclic alicyclic hydrocarbon group. With regard to this, it is not necessary for the alicyclic hydrocarbon group to be constituted with only an alicyclic structure; it may include a chain structure in a part thereof. The "aromatic hydrocarbon group" as referred to herein means a hydrocarbon group that includes an aromatic ring structure as a ring structure. With regard to this, it is not necessary for the aromatic hydrocarbon group to be constituted with only an aromatic ring structure; it may include a chain structure and/or an alicyclic structure in a part thereof. The number of "ring atoms" as referred to herein means the number of atoms constituting the ring in an alicyclic structure, an aromatic ring structure, an aliphatic heterocyclic structure, or an aromatic heterocyclic structure, and in the case of a polycyclic ring structure, the number of "ring atoms" means the number of atoms constituting the polycyclic ring.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include:

alkyl groups such as a methyl group, an ethyl group, an n-propyl group, and an i-propyl group;

alkenyl groups such as an ethenyl group, a propenyl group, and a butenyl group;

alkynyl groups such as an ethynyl group, a propynyl group, and a butynyl group; and the like.

Examples of the monovalent alicyclic hydrocarbon group having 3 to 20 carbon atoms include:

monocyclic alicyclic saturated hydrocarbon groups such as a cyclopentyl group and a cyclohexyl group;

monocyclic alicyclic unsaturated hydrocarbon groups such as a cyclopentenyl group and a cyclohexenyl group;

polycyclic alicyclic saturated hydrocarbon groups such as a norbornyl group, an adamantyl group, and a tricyclodecyl group;

polycyclic alicyclic unsaturated hydrocarbon groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group, and an anthryl group;

aralkyl groups such as a benzyl group, a phenethyl group, a naphthylmethyl group, and an anthrylmethyl group; and the like.

The hetero atom constituting the divalent hetero atom-containing group or the monovalent hetero atom-containing group is exemplified by an oxygen atom, a sulfur atom, a phosphorus atom, a silicon atom, and a halogen atom. Examples of the halogen atom include a fluorine atom, a chlorine atom, a bromine atom, an iodine atom, and the like.

Examples of the divalent hetero atom-containing group include —O—, —CO—, —S—, —CS—, a combination of two or more of these, and the like. Of these, —O— is preferred.

Examples of the monovalent hetero atom-containing group include a halogen atom, and the like.

X in the above formula (1) represents preferably a hydrogen atom or —SH, and more preferably a hydrogen atom.

The upper limit of n in the above formula (1) is preferably 10, and more preferably 5.

The lower limit of a proportion of the structural units represented by $(-L^1(-A^1)-)$ in the above formula (1) with respect to total structural units constituting the polymer (A) is preferably 0.1 mol %, more preferably 0.5 mol %, still more preferably 1 mol %, and particularly preferably 2 mol %. The upper limit of the proportion is preferably 30 mol %, more preferably 20 mol %, still more preferably 10 mol %, and particularly preferably 7 mol %.

The monovalent hydrocarbon group having 1 to 20 carbon atoms which may be represented by R in —NR—, which may be represented by $L^2$ in the above formula (2), is exemplified by groups similar to the monovalent hydrocarbon groups having 1 to 20 carbon atoms exemplified as X in the above formula (1), and the like. $L^2$ is preferably —S— or —NR—, and of —NR—, —NH— is preferred.

m is preferably 0.

The terminal structure (I) is exemplified by a structure containing a block derived from vinylphosphoric acid, a structure containing a block derived from (meth)acrylic acid, a structure containing a block being (—CH$_2$—CH(OH)—), and the like.

The terminal structure (II) is exemplified by a cyanoalkyl group, a carboxyalkyl group, a hydroxyalkyl group, and the like.

The functional group (M) in the terminal structure (I) is preferably different from the functional group (M) in the terminal structure (II). When the functional (M) in the terminal structure (I) is different from the functional group (M) in the terminal structure (II), forming of the metal-containing layer (Y) containing a metal atom which differs from the metal atom (A) in the metal basal plate (X) is facilitated.

It is preferable that the terminal structure (I) is the structure (1) and the terminal structure (II) is the structure (2). When each of the terminal structures is the aforementioned structure, forming of the metal-containing layer (Y) containing a metal atom which differs from the metal atom (A) in the metal basal plate (X) is facilitated.

Structural Unit (A)

The structural unit (A) is derived from the monomer (a). The polymer (A) typically has the structural unit (A) between the terminal structure (I) and the terminal structure (II).

The monomer (a) which gives the structural unit (A) is exemplified by a vinyl aromatic compound, (meth)acrylic acid or a (meth)acrylic acid ester, substituted or unsubstituted ethylene, a polymerizable compound having a crosslinkable group, and the like. The "crosslinkable group" as referred to herein means a group capable of forming a cross-linked structure through a reaction under heating conditions, under active energy ray-irradiating conditions, under acidic conditions, or the like. The monomer (a) may be one, or two or more types of these compounds.

Examples of the vinyl aromatic compound include:

styrene;

substituted styrenes such as α-methylstyrene, o-methylstyrene, m-methylstyrene, p-methyl styrene, p-tert-butyl styrene, 2,4,6-trimethylstyrene, p-methoxystyrene, p-tert-butoxystyrene, o-hydroxystyrene, m-hydroxystyrene, p-hydroxystyrene, m-chloromethyl styrene, p-chloromethyl styrene, p-chlorostyrene, p-bromostyrene, p-iodostyrene, p-nitrostyrene, and p-cyanostyrene;

vinylnaphthalene;

substituted vinylnaphthalenes such as vinylmethylnaphthalene and vinylchloronaphthalene;

vinylanthracene;

substituted vinylanthracenes such as vinylmethylanthracene and vinylchloroanthracene;

vinylpyrene;

substituted vinylpyrenes such as vinylmethylpyrene and vinylchloropyrene; and the like.

Examples of the (meth)acrylic acid ester include:

(meth)acrylic acid alkyl esters such as methyl (meth)acrylate, ethyl (meth)acrylate, t-butyl (meth)acrylate, and 2-ethylhexyl (meth)acrylate;

(meth)acrylic acid cycloalkyl esters such as cyclopentyl (meth)acrylate, cyclohexyl (meth)acrylate, 1-methylcyclopentyl (meth)acrylate, 2-ethyladamantyl (meth)acrylate, and 2-(adamantan-1-yl)propyl (meth)acrylate;

(meth)acrylic acid substituted alkyl esters such as 2-hydroxyethyl (meth)acrylate, 3-hydroxyadamantyl (meth)acrylate, 3-glycidylpropyl (meth)acrylate, and 3-trimethylsilylpropyl (meth)acrylate; and the like.

Examples of the substituted ethylene include:

alkenes such as propene, butene, and pentene;

vinylcycloalkanes such as vinylcyclopentane and vinylcyclohexane;

cycloalkenes such as cyclopentene and cyclohexene;

vinylphosphoric acid, 4-hydroxy-1-butene, vinyl glycidyl ether, vinyl trimethyl silyl ether, and the like.

The crosslinkable group in the polymerizable compound having the crosslinkable group is exemplified by:

polymerizable carbon-carbon double bond-containing groups such as a vinyl group, a vinyloxy group, an allyl group, a (meth)acryloyl group, and a styryl group;

cyclic ether groups such as an oxiranyl group, an oxiranyloxy group, an oxetanyl group, and an oxetanyloxy group;

cyclobutene ring-fused aryl groups, such as a phenyl group to which a cyclobutene ring is fused, and a naphthyl group to which a cyclobutene ring is fused;

aryl groups to which an aromatic hydroxy group protected by an acyl group or a thermally labile group bonds, such as an acetoxyphenyl group and a t-butoxyphenyl group;

aryl groups to which a methylol group (—CH$_2$OH) protected by an acyl group or a thermally labile group bonds, such as an acetoxymethylphenyl group and a methoxymethylphenyl group;

aryl groups to which a substituted or unsubstituted sulfanylmethyl group (—CH$_2$SH) bonds, such as a sulfanylmethylphenyl group and a methylsulfanylmethylphenyl group; and the like.

The aryl groups to which a cyclobutene ring is fused form a covalent bond to each other under heating conditions.

The "acyl group" as referred to herein is a group obtained by removing OH from a carboxylic acid, and means a group that protects an aromatic hydroxy group or a methylol group by substituting for a hydrogen atom. The "heat-labile group" as referred to herein is a group that substitutes for a hydrogen atom of an aromatic hydroxy group, a methylol group, or a sulfanylmethyl group, and means a group that dissociates by heating.

Examples of the acyl group in the aryl group to which the aromatic hydroxy group, the methylol group, or the sulfanylmethyl group, each group being protected, bonds include a formyl group, an acetyl group, a propionyl group, a butyryl group, a benzoyl group, and the like.

Examples of the thermally labile group in the aryl group to which the aromatic hydroxy group being protected bonds include tertiary alkyl groups such as a t-butyl group and a t-amyl group, and the like. Examples of the thermally labile group in the aryl group to which the methylol group or the sulfanylmethyl group, each being protected, bonds include alkyl groups such as a methyl group, an ethyl group, and a propyl group, and the like.

Examples of the polymerizable compound having the crosslinkable group include vinyl compounds having a crosslinkable group such as styrene having a crosslinkable group, (meth)acrylic compounds having a crosslinkable group, and the like.

The structural unit (A) is preferably a structural unit (hereinafter, may be also referred to as "structural unit (A-1)") derived from hydrocarbon-substituted or unsubstituted styrene. When the structural unit (A) is the structural unit (A-1) which does not have the functional group (M), the metal-containing layer (Y) can be more effectively formed.

Examples of the monomer (a) which gives the structural unit (A-1) include:

styrene, α-methylstyrene, o-methylstyrene, m-methylstyrene, p-methylstyrene, p-pert-butyl styrene, and 2,4,6-trimethylstyrene; and further, of polymerizable compounds having the crosslinkable group, o-vinylstyrene, m-vinylstyrene, p-vinyl styrene, 4-vinylbenzocyclobutene, and the like.

In the case in which the structural unit (A) includes at least one selected from the group consisting of the structural unit derived from the vinyl aromatic compound, the structural unit derived from (meth)acrylic acid or the (meth)acrylic acid ester, and the structural unit derived from substituted or unsubstituted ethylene, the lower limit of a total proportion of these structural units in the structural unit (A) is preferably 50 mol %, more preferably 80 mol %, still more preferably 90 mol % and particularly preferably 95 mol %. The upper limit of the proportion may be 100 mol %.

In the case in which the structural unit (A) includes the structural unit derived from the polymerizable compound having the crosslinkable group, the lower limit of a proportion of these structural units in the structural unit (A) is preferably 0.1 mol %, more preferably 0.5 mol %, still more preferably 1 mol %, and particularly preferably 2 mol %. The upper limit of the proportion is preferably 30 mol %, more preferably 20 mol %, still more preferably 10 mol %, and particularly preferably 5 mol %.

The lower limit of a number average molecular weight (Mn) of the polymer (A) is preferably 1,000, more preferably 2,000, still more preferably 3,000, and particularly preferably 4,000. The upper limit of the Mn is preferably 100,000, more preferably 50,000, still more preferably 30,000, and particularly preferably 10,000. When the Mn of the polymer (A) falls within the above range, the metal-containing layer (Y) can be more effectively formed.

The upper limit of a ratio (dispersity index) of the Mn to a weight average molecular weight (Mw) of the polymer (A) is preferably 5, more preferably 2, still more preferably 1.5, and particularly preferably 1.3. The lower limit of the ratio is typically 1, and preferably 1.05.

The lower limit of a content of the polymer (A) with respect to total solid content in the composition (S) is preferably 60% by mass, more preferably 80% by mass, still more preferably 90% by mass, and particularly preferably 95% by mass. The upper limit of the content may be 100% by mass. The "total solid content" as referred to herein means the content of all components in the composition (S) except for the solvent (B).

Synthesis Procedure of Polymer

In the case in which the polymer (A) is a polymer in which the terminal structure (I) is the structure (1) and the terminal structure (II) is the structure (2), the polymer (A) can be synthesized by, for example, using a polymerization initiator such as azobisisobutyronitrile (AIBN) that gives the structure (2) to first polymerize the monomer (a) such as styrene, tert-butylstyrene, or 4-vinylbenzocyclobutene that gives the structural unit (A), and then to polymerize the monomer such as vinylphosphoric acid that gives the structure (1), thereby forming the block.

In the polymerization, RAFT (Reversible Addition-Fragmentation Chain Transfer) polymerization may be carried out by using a RAFT agent, e.g., a trithiocarbonate compound such as 2-cyano-2-propyldodecyl trithiocarbonate or dibenzyl trithiocarbonate, a dithiocarbamate compound such as cyanomethyl-N-methyl-N-phenyl dithiocarbamate, a dithiobenzoate compound such as 2-cyano-2-propyl benzodithioate, a xanthate compound such as O-ethyl-S-cyanomethyl xanthogenate, or the like. Furthermore, a radical generating agent such as AIBN and a thiol compound such as tert-dodecanethiol may be added to a polymer obtained by the RAFT polymerization carried out by using the RAFT agent described above, whereby a cleavage reaction is allowed at an end such as a trithiocarbonate end, and thus the end of the main chain of the polymer (A) may be a hydrogen atom or the like. In this cleavage reaction, it is preferred to use a protonic solvent such as an alcohol as a proton-supplying source, in addition to the radical generating agent and the thiol compound.

The polymer (A) other than the aforementioned polymer can also be synthesized by a well-known procedure.

(B) Solvent

The solvent (B) is not particularly limited as long as it is a solvent capable of dissolving or dispersing at least the polymer (A), the other component(s), and the like.

The solvent (B) is exemplified by an alcohol solvent, an ether solvent, a ketone solvent, an amide solvent, an ester solvent, a hydrocarbon solvent, and the like.

Examples of the alcohol solvent include:
monohydric alcohol solvents such as methanol and ethanol;
polyhydric alcohol solvents such as ethylene glycol and 1,2-propylene glycol;
polyhydric alcohol partial ether solvents such as ethylene glycol monomethyl ether, ethylene glycol monoethyl ether, propylene glycol monomethyl ether, and propylene glycol monoethyl ether;
lactic acid ester solvents such as methyl lactate, ethyl lactate, n-butyl lactate, and n-amyl lactate; and the like.

Examples of the ether solvent include:
dialkyl ether solvents such as diethyl ether;
cyclic ether solvents such as tetrahydrofuran;
aromatic ring-containing ether solvents such as anisole; and the like.

Examples of the ketone solvent include:
chain ketone solvents such as butanone and methyl isobutyl ketone;
cyclic ketone solvents such as cyclopentanone and cyclohexanone; and the like.

Examples of the amide solvent include:
cyclic amide solvents such as N,N'-dimethylimidazolidinone and N-methylpyrrolidone;
chain amide solvents such as N-methylformamide and N,N-dimethylformamide; and the like.

Examples of the ester solvent include:
acetic acid ester solvents such as ethyl acetate and n-butyl acetate;
polyhydric alcohol partial ether carboxylate solvents such as ethylene glycol monomethyl ether acetate, diethylene glycol monomethyl ether acetate, and propylene glycol monomethyl ether acetate;
lactone solvents such as γ-butyrolactone and valerolactone;
carbonate solvents such as ethylene carbonate and propylene carbonate; and the like.

Examples of the hydrocarbon solvent include:
aliphatic hydrocarbon solvents such as n-hexane;
aromatic hydrocarbon solvents such as toluene; and the like.

Of these, the solvent (B) is preferably the ester solvent, more preferably the polyhydric alcohol partial ether carboxylate solvent, and still more preferably propylene glycol monomethyl ether acetate. The composition (S) may contain one, or two or more types of the solvent (B).

Other Component(s)

The other component(s) is/are exemplified by an acid generating agent or a base generating agent, a crosslinking agent, a surfactant, and the like.

Acid Generating Agent or Base Generating Agent

The acid generating agent is a component capable of generating an acid by an action of heat and/or a radioactive ray. The base generating agent is a component capable of generating a base by an action of heat and/or a radioactive ray. In a case in which the composition (S) contains the acid generating agent or the base generating agent, an acid or a base is generated upon irradiation with a radioactive ray and/or heating in a heating step or the like, thereby enabling promoting of a crosslinking reaction or the like in the polymer (A) and/or the like. The composition (S) may contain one, or two or more types of the acid generating agent or the base generating agent.

The acid generating agent is exemplified by an onium salt compound, an N-sulfonyloxyimide compound, and the like.

Examples of the onium salt compound include sulfonium salts such as triphenylsulfonium trifluoromethanesulfonate, tetrahydrothiophenium salts such as 1-(4-n-butoxynaphthalen-1-yl)tetrahydrothiophenium trifluoromethanesulfonate, iodonium salts such as diphenyliodonium trifluoromethanesulfonate, ammonium salts such as triethylammonium trifluoromethanesulfonate, and the like. Examples of the N-sulfonyloxyimide compound include N-(trifluoromethylsulfonyloxy)bicyclo[2.2.1]hept-5-ene-2,3-dicarboxyimide and the like.

Examples of the base generating agent include 4-(methylthiobenzoyl)-1-methyl-1-morpholinoethane, (4-morpholinobenzoyl)-1-benzyl-1-dimethylaminopropane, 2-benzyl-2-dimethylamino-1-(4-morpholinophenyl)-butanone, N-(2-nitrobenzyloxycarbonyl)pyrrolidine, 1-(anthraquinone-2-yl)ethylimidazolecarboxylate, 2-nitrobenzylcyclohexylcarbamate, [[(2,6-dinitrobenzyl)oxy]carbonyl]cyclohexylamine, bis[[(2-nitrobenzyl)oxy]carbonyl]hexane-1,6-diamine, triphenylmethanol, o-carbamoylhydroxylamide, o-carbamoyloxime, hexaamminecobalt(III) tris(triphenylmethylborate), and the like.

In the case in which the composition (S) contains the acid generating agent or the base generating agent, the lower limit of a content of the acid generating agent or the base generating agent with respect to 100 parts by mass of the polymer (A) is preferably 0.1 parts by mass, and more preferably 1 part by mass. The upper limit of the content is preferably 20 parts by mass, and more preferably 5 parts by mass.

Crosslinking Agent

The crosslinking agent is a component capable of forming a crosslinking bond between components such as the polymer (A), or capable of forming a cross-linked structure per se, by an action of heat and/or an acid. When the composition (S) contains the crosslinking agent, an increase in hardness of the coating film (P) to be formed is enabled, thereby enabling the metal-containing layer (Y) to be more effectively formed. The composition (S) may contain one, or two or more types of the crosslinking agent.

Examples of the crosslinking agent include: a polyfunctional (meth)acrylate compound such as trimethylolpropane tri(meth)acrylate; an epoxy compound such as a novolak-type epoxy resin; a hydroxymethyl group-substituted phenol compound such as 2-hydroxymethyl-4,6-dimethylphenol; an alkoxyalkyl group-containing phenol compound such as 4,4'-(1-(4-(1-(4-hydroxy-3,5-bis(methoxymethyl)phenyl)-1-methylethyl)phenyl)ethylidene)bis(2,6-bis(methoxymethyl)phenol; a compound having an alkoxyalkylated amino group such as (poly)methylolated melamine; a random copolymer of acenaphthylene and hydroxymethylacenaphthylene; and the like.

In the case in which the composition (S) contains the crosslinking agent, the lower limit of a content of the crosslinking agent with respect to 100 parts by mass of the polymer (A) is preferably 1 part by mass, and more preferably 5 parts by mass. The upper limit of the content is preferably 100 parts by mass, and more preferably 30 parts by mass.

Surfactant

The surfactant is a component capable of improving coating properties on the metal basal plate (X) of the composition (S).

In the case in which the composition (S) contains the surfactant, the upper limit of a content of the surfactant with respect to 100 parts by mass of the polymer (A) is preferably 10 parts by mass, and more preferably 2 parts by mass. The lower limit of the content is, for example, 0.1 parts by mass.

Preparation Procedure of Composition

The composition (S) may be prepared, for example, by mixing the polymer (A) and the solvent (B), as well as the other component(s) which is/are added as needed, in a certain ratio, and preferably filtering a thus resulting mixture through a high-density polyethylene filter or the like having fine pores with a pore size of about 0.45 µm. The lower limit of a solid content concentration of the composition (S) is preferably 0.1% by mass, more preferably 0.5% by mass, and still more preferably 0.7% by mass. The upper limit of the solid content concentration is preferably 30% by mass, more preferably 10% by mass, and still more preferably 3% by mass.

Metal-Containing Layer-Forming Step

By this step, the metal-containing layer (Y) is formed on at least a part of the upper face of the coating film (P) formed in the applying step.

Examples of the metal atom (B) contained in the metal-containing layer (Y) include metal atoms exemplified above as the metal atom (A) contained in the metal basal plate (X), and the like. Of these, an atom of copper or cobalt is preferred.

A procedure of forming the metal-containing layer (Y) is exemplified by: a procedure in which the metal basal plate (X), with the coating film (P) being formed thereon, is immersed in a liquid containing the metal atom (B); a procedure in which the metal atom (B) is attached to a surface of the coating film (P), being formed on the metal basal plate (X), by chemical vapor deposition (CVD) or atomic layer deposition (ALD); and the like.

In the immersing procedure, the liquid containing the metal atom (B) to be used is exemplified by an aqueous solution of a metal salt such as copper sulfate or cobalt chloride, and the like. A concentration of the metal chloride in the aqueous solution of the metal salt is, for example, typically no less than 0.01 mol/L and no greater than 3 mol/L, and preferably no less than 0.1 mol/L and no greater than 1 mol/L. A time period of the immersing is, for example, typically no less than 1 min and no greater than 1 day, and preferably no less than 1 hour and no greater than 100 hrs.

After the immersing, the metal atom (B) which has not chemically bonding to the functional group (M) in the coating film (P) is preferably eliminated by washing with ultra pure water or the like.

Examples of the CVD include a variety of procedures such as thermal CVD, plasma CVD, photo-assisted CVD, low-pressure CVD, laser CVD, and organic metal CVD (MOCVD).

Examples of the ALD include thermal ALD, plasma ALD, and the like.

The lower limit of an average thickness of the metal-containing layer (Y) to be formed is preferably 0.1 nm, more preferably 1 nm, and still more preferably 2 nm. The upper limit of the average thickness is preferably 500 nm, more preferably 100 nm, and still more preferably 50 nm.

The metal atom (B) contained in the metal-containing layer (Y) is preferably different from the metal-containing atom (A) contained in the metal basal plate (X). When the metal atom (B) is different from the metal atom (A), the metal-containing layer (Y) can be more effectively formed.

Furthermore, in the case in which the metal basal plate (X) contains the metal atom (A) and the metal-containing layer (Y) contains the metal atom (B) which is different from the metal atom (A), it is preferable that in the polymer (A), the terminal structure (I) has a functional group capable of forming a chemical bond with the metal atom (A), and the terminal structure (II) has a functional group capable of forming a chemical bond with the metal atom (B). When the combination of the structures of the metal basal plate (X), the metal-containing layer (Y), and the polymer (A) is thus designed, the metal-containing layer (Y) can be more easily formed on the surface of the metal basal plate (X).

In such a case, the functional group capable of forming a chemical bond with the metal atom (A) is preferably a phosphoric acid group. Moreover, the functional group capable of forming a chemical bond with the metal atom (B) is preferably at least one selected from the group consisting of a nitrile group, a carboxy group, an ester group, and a hydroxy group. When the functional group (M) has the above constitution, owing to intensity of bonding strength between each functional group (M) and the metal atoms, the metal-containing layer (Y) can be more effectively formed on the surface of the metal basal plate (X).

According to the method of producing a substrate of the one embodiment, the metal-containing layer (Y) can be easily formed on the surface of the metal basal plate (X). In the method of producing a substrate, by using, as the metal basal plate (X), a metal basal plate of cobalt, copper, or the like having trenches with a pattern of polysiloxane or the like formed on a surface of the metal basal plate (X), the metal-containing layer (Y) can be formed on the metal surface of bottoms of the trenches. It is considered that using the basal plate in which the metal-containing layer (Y) has been formed on the bottoms of such trenches promotes growth of a plated layer at a time of conducting a plating treatment.

EXAMPLES

Hereinafter, the present invention is explained in detail by way of Examples, but the present invention is not in any way limited to these Examples. Measuring methods for various types of physical properties are shown below.

Mw and Mn

Measurements of the Mw and the Mn of the polymer were carried out by gel permeation chromatography (GPC) using GPC columns available from Tosoh Corporation ("G2000 HXL"×2, "G3000 HXL"×1 and "G4000 HXL"×1) under the following analytical conditions.

eluent: tetrahydrofuran (Wako Pure Chemical Industries, Ltd.)
flow rate: 1.0 mL/min
sample concentration: 1.0% by mass
amount of injected sample: 100 uL
column temperature: 40° C.
detector: differential refractometer
standard substance: mono-dispersed polystyrene $^{13}$C-NMR Analysis $^{13}$C-NMR analysis was carried out by using a nuclear magnetic resonance apparatus ("JNM-EX400," available from JEOL, Ltd.), with DMSO-$d_6$ used as a solvent for measurement. The proportion of each structural unit contained in the polymer was calculated from an area ratio of peaks corresponding to each structural unit on the spectrum obtained by the $^{13}$C-NMR.

Synthesis of (A) Polymer

Synthesis Example 1

Into a 200 mL three-neck flask as a reaction vessel, 0.098 g of azobisisobutyronitrile (AIBN), 10.63 g of styrene, 0.83 g of 2-cyano-2-propyldodecyltrithiocarbonate, and 20 g of anisole were added, and a resulting mixture was heated in a nitrogen atmosphere at 80° C. for 5 hrs with stirring. Next, 0.68 g of vinylphosphoric acid and 1.0 g of propylene glycol monomethyl ether were added thereto, and a resulting mixture was heated at 80° C. for 3 hrs with stirring. A resulting polymerization reaction liquid was charged into 300 g of methanol to permit purification by precipitation, yellow, sticky matter thus obtained was collected and dissolved in 20 g of propylene glycol monomethyl ether acetate. To a solution thus obtained were added 0.49 g of AIBN and 2.03 g of tert-dodecanethiol, and a resulting mixture was heated at 80° C. for 2 hrs with stirring, whereby a cleavage reaction was allowed at a trithiocarbonate end. A polymerization reaction liquid thus obtained was concentrated in vacuo, and a concentrate thus obtained was charged into 1,000 g of methanol to permit purification by precipitation to give a pale yellow solid. Next, drying the solid under reduced pressure at 60° C. gave 10.5 g of a polymer (A-1). With regard to the polymer (A-1), the Mw was 5,600, the Mn was 4,800, and the Mw/Mn was 1.17.

Synthesis Example 2

Into a 200 mL three-neck flask as a reaction vessel, 0.098 g of AIBN, 0.83 g of 2-cyano-2-propyldodecyltrithiocarbonate, 17.6 g of tert-butylstyrene, 0.78 g of 4-vinylbenzocyclobutene, and 20 g of anisole were added, and a resulting mixture was heated in a nitrogen atmosphere at 80° C. for 5 hrs with stirring. Next, 0.68 g of vinylphosphoric acid and 1.0 g of propylene glycol monomethyl ether were added thereto, and a resulting mixture was heated at 80° C. for 3 hrs with stirring. A resulting polymerization reaction liquid was charged into 300 g of methanol to permit purification by precipitation, a yellow, sticky substance thus obtained was collected and dissolved in 20 g of propylene glycol monomethyl ether acetate. To a solution thus obtained were added 0.49 g of AIBN and 2.03 g of tert-dodecanethiol were added, and a resulting mixture was heated at 80° C. for 2 hrs with stirring, whereby a cleavage reaction was allowed at a trithiocarbonate end. A polymerization reaction liquid thus obtained was concentrated in vacuo, and a concentrate thus obtained was charged into 1,000 g of methanol to permit purification by precipitation to give a pale yellow solid. Next, drying the solid under reduced pressure at 60° C. gave 14.6 g of a polymer (A-2). With regard to the polymer (A-2), the Mw was 6,300, the Mn was 4,900, and the Mw/Mn was 1.29.

Synthesis Example 3

A 500 mL flask as a reaction vessel was dried under reduced pressure, and then 120 g of tetrahydrofuran (THF), which had been subjected to a dehydrating treatment by distillation, and 9.2 mL of a THF solution of 0.5 N lithium chloride were charged thereinto, followed by cooling to −78° C. Next, into this THF solution was charged 2.38 mL of a 1 N cyclohexane solution of sec-butyllithium (sec-BuLi), and then 13.3 mL of styrene which had been subjected to: adsorptive filtration by means of silica gel; and a dehydration treatment by distillation, for removing the polymerization inhibitor, was added dropwise over 30 min. The polymerization system color was ascertained to be orange. During the dropwise addition, the internal temperature of the reaction solution was carefully controlled so as not to be −60° C. or higher. After completion of the dropwise addition, aging was permitted for 30 min. Next, 0.19 mL of 3-bromopropionitrile was charged into a resulting mixture to conduct a terminating reaction of the polymerization end. The temperature of the reaction solution was elevated to room temperature, and the reaction solution was concentrated and substituted with methyl isobutyl ketone (MIBK). Thereafter, into a resulting mixture was charged 1,000 g of a 2% by mass aqueous oxalic acid solution, and the mixture was stirred. After being left to stand, the aqueous underlayer was removed. This operation was repeated three times to remove the Li salt. Thereafter, 1,000 g of ultra pure water was charged and the mixture was stirred, followed by removing the aqueous underlayer. This operation was repeated three times to remove oxalic acid, and the solution was concentrated. Subsequently, the concentrate was added dropwise into 500 g of methanol to allow the polymer to be precipitated, and the solid was collected on a Buechner funnel. A thus obtained solid was dried under reduced pressure at 60° C. to give 11.9 g of a white polymer (A-3). With regard to the polymer (A-3), the Mw was 5,600, the Mn was 5,200, and the Mw/Mn was 1.08.

Preparation of Composition (S)

Synthesis Example 1

The composition (S-1) was prepared by: adding to 1.20 g of (A-1) as the polymer (A), 98.80 g of propylene glycol monomethyl ether acetate (PGMEA) as the solvent (B), followed by stirring of the mixture and then filtering through a high-density polyethylene filter having fine pores of 0.45 μm.

Preparation Example 2 and Comparative Preparation Example 1

Each of compositions (S-2) and (S-3) was prepared by a similar operation to that of Composition Example 1, except that each monomer of the type and in the amount shown in Table 1 below was used.

TABLE 1

| Amount (g) | | Preparation Example 1 | Preparation Example 2 | Comparative Preparation Example 1 |
|---|---|---|---|---|
| Composition (S) | | S-1 | S-2 | S-3 |
| (A) Polymer | A-1 | 1.20 | — | — |
| | A-2 | — | 1.20 | — |
| | A-3 | — | — | 1.20 |
| (B) Solvent | B-1 | 98.80 | 98.80 | 98.80 |
| Solid content concentration (% by mass) | | 1.2 | 1.2 | 1.2 |

Production of Substrate

Examples 1 and 2 and Comparative Example 1

Applying of Composition

An 8-inch cobalt basal plate was immersed in a 5% by mass aqueous oxalic acid solution, followed by drying by a nitrogen flow, and removing an oxidized coating film on the surface. A copper basal plate was subjected to a similar treatment. A silicon oxide (SiO$_2$) basal plate was subjected to a surface treatment with isopropanol.

Next, the compositions shown in Table 2 below were spin-coated by using Track ("TELDSA ACT8," available from Tokyo Electron Limited) at 1,500 rpm, and baked at 100° C. for 180 sec.

The contact angle values of water with respect to surfaces of the thus obtained substrates, being coated with the compositions (S), were measured by using a contact angle meter ("Drop master DM-501" available from Kyowa Interface Science Co., Ltd.). The measurement values of the contact angles are shown in Table 2 below.

TABLE 2

| Composition | | Contact angle (°) | | |
|---|---|---|---|---|
| | (S) | Co | Cu | SiO$_2$ |
| Blank | — | <10 | <10 | 56 |
| Example 1 | S-1 | 89 | 90 | 48 |
| Example 2 | S-2 | 98 | 100 | 46 |
| Comparative Example 1 | S-3 | 89 | 99 | 39 |

Applying of Composition and Formation of Metal-Containing Layer

Examples 1 and 2 and Comparative Example 1

The cobalt basal plate and the copper basal plate were each cut into coupon shapes being 3 cm×3 cm, and the spin coater was used to apply the compositions (S) shown in Tables 3 and 4 below on a surface of each of the basal plates at 1,500 rpm, followed by baking at 100° C. for 180 sec. Next, the polymer (A) not chemically bonding to the surface of each metal basal plate was removed using PGMEA, following by drying by a nitrogen flow.

Next, the metal basal plates were immersed for 72 hrs in a petri dish having 20 g of an aqueous metal salt solution charged therein, i.e., the cobalt basal plate thus obtained being immersed in a 1 M aqueous copper sulfate solution and the copper basal plate thus obtained being charged in a 1 M aqueous cobalt chloride solution. Thereafter, copper sulfate or cobalt chloride not chemically bonding to the polymer (A) was removed with ultra pure water, followed by drying by a nitrogen flow.

The surface of each of the substrates thus obtained was analyzed using a scanning X-ray photoelectron spectroscope ("Quantum 2000," available from Ulvac-Phi Inc.) to conduct a qualitative and quantitative analysis. The results of the evaluations are shown together in Tables 3 and 4 below. "others" in the field "ESCA (XPS) surface data" includes bare Si, thermal oxide, TiN, Ti on multiple layers of Co, N, Si, and the like.

TABLE 3

| | Composition | ESCA (XPS) surface data (atom %) | | | | |
|---|---|---|---|---|---|---|
| | (S) | C (1s) | O (1s) | Co (2p3) | Cu (2p3) | others |
| Co basal plate | — | 33.5 | 42.7 | 23.8 | — | — |
| Example 1 | S-1 | 62.3 | 19.6 | — | 13.6 | 4.5 |
| Example 2 | S-2 | 49.5 | 12.5 | — | 25 | 13 |
| Comparative Example 1 | S-3 | 52.7 | 19.3 | 1.9 | — | 26.1 |

TABLE 4

| | Composition | ESC A (XPS) surface data (atom %) | | | | |
|---|---|---|---|---|---|---|
| | (S) | C (1s) | O (1s) | Co (2p3) | Cu (2p3) | others |
| Cu basal plate | — | 33.9 | 50.5 | | 15.6 | |
| Example 1 | S-1 | 54.6 | 22.1 | 2.9 | | 20.4 |
| Example 2 | S-2 | 52.7 | 25.4 | 2.1 | | 19.8 |
| Comparative Example 1 | S-3 | 42.8 | 38.1 | | 4.2 | 14.9 |

From the results shown in Table 3, it is seen that Cu components were detected from the substrates in which the compositions (S) were applied on the cobalt basal plate, followed by immersing in the 1 M aqueous copper sulfate solution and adsorption; and from the results shown in Table 4, it is seen that Co components were detected from the substrates in which the compositions (S) were applied on the copper basal plate, followed by immersing in a 1 M aqueous cobalt chloride solution and adsorption. According to the method of producing the substrate, the substrate in which the metal-containing layer is formed on the surface of the metal basal plate can be thus produced.

According to the method of producing a substrate of the one embodiment of the present invention, the substrate in which the metal-containing layer is formed on the surface of the metal basal plate can be produced. The composition of the embodiment of the present invention can be suitably used in the method of producing a substrate of the one embodiment of the present invention. The polymer of the embodiment of the present invention can be suitably used as a polymer component of the composition of the embodiment of the present invention. Therefore, these can be suitably used in manufacturing processes of semiconductor devices, in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A method of producing a substrate, the method comprising:
    applying a composition on a metal basal plate to form a coating film; and
    forming a metal-containing layer on at least a part of the coating film, wherein
    the composition comprises a solvent, and a polymer comprising a first terminal structure and a second terminal structure in a single molecule, wherein
    the first terminal structure is a structure represented by formula (1), and the second terminal structure is represented by formula (2),

wherein:
    in the formula (1), $L^1$ represents a trivalent group having 1 to 20 carbon atoms; $A^1$ represents a monovalent group comprising a functional group capable of forming a chemical bond with a metal atom; X represents a hydrogen atom, —SH, —S-$A^{11}$, or a monovalent organic group having 1 to 20 carbon atoms, wherein $A^{11}$ represents a monovalent group comprising a functional group capable of forming a chemical bond with a metal atom; n denotes a number of structural units constituting a block represented by $(-L^1(-A^1)-)_n$, and is an integer of no less than 2, wherein a plurality of $A^1$s are identical or different, and $A^1$ and $A^{11}$ are identical or different; and * denotes a site bonding to a part other than the structure represented by the formula (1) in the polymer; and
    in the formula (2), $L^2$ represents —S—, —NR—, or —N$A^{22}$-, wherein R represents a hydrogen atom or a monovalent hydrocarbon group having 1 to 20 carbon atoms, and $A^{22}$ represents a monovalent group comprising a functional group capable of forming a chemical bond with a metal atom; $A^2$ represents a monovalent group comprising a functional group capable of forming a chemical bond with a metal atom, and $A^2$ and $A^{22}$ are identical or different; m is 0 or 1; and * denotes a site bonding to a part other than the structure represented by the formula (2) in the polymer, and
    wherein the polymer is synthesized by: polymerizing first monomers in a presence of a polymerization initiator that gives the second terminal structure; and then by polymerizing second monomers each of which gives the first terminal structure.

2. The method according to claim 1, wherein in the polymer, the functional group which is capable of forming a chemical bond with a metal atom and is in the first terminal structure, and the functional group which is capable of forming a chemical bond with a metal atom and is in the second terminal structure are different from each other.

3. The method according to claim 1, wherein $A^1$ in the formula (1) represents a phosphoric acid group, and $A^2$ in the formula (2) represents at least one selected from the group consisting of a nitrile group, a carboxy group, an ester group, and a hydroxy group.

4. The method according to claim 1, wherein X in the formula (1) is —SH or a hydrogen atom.

5. The method according to claim 1, wherein n in the formula (1) is an integer of 2 to 10.

6. The method according to claim 1, wherein the polymer comprises a structural unit derived from hydrocarbon group-substituted or unsubstituted styrene.

7. The method according to claim 1, wherein:
    the metal basal plate comprises a first metal atom, and the metal-containing layer comprises a second metal atom being different from the first metal atom; and
    in the polymer, the functional group of the first terminal structure is capable of forming a chemical bond with the first metal atom, and the functional group of the second terminal structure is capable of forming a chemical bond with the second metal atom.

8. The method according to claim 7, wherein
    the functional group of the first terminal structure is a phosphoric acid group, and
    the functional group of the second terminal structure is at least one selected from the group consisting of a nitrile group, a carboxy group, an ester group, and a hydroxy group.

9. The method according to claim 7, wherein the polymerization initiator is azobisisobutyronitrile.

10. The method according to claim 7, wherein the polymer is synthesized by RAFT (Reversible Addition-Fragmentation Chain Transfer) polymerization.

11. The method according to claim 7, wherein the first terminal structure comprises a block derived from vinylphosphoric acid.

12. The method according to claim 7, wherein the second terminal structure is a cyanoalkyl group.

13. The method according to claim 7, wherein X in the formula (1) is —SH or a hydrogen atom.

14. The method according to claim 7, wherein n in the formula (1) is an integer of 2 to 10.

15. The method according to claim 7, wherein the polymer comprises a structural unit derived from a hydrocarbon group-substituted or unsubstituted styrene.

16. The method according to claim 1, wherein the polymerization initiator is azobisisobutyronitrile.

17. The method according to claim 1, wherein the polymer is synthesized by RAFT (Reversible Addition-Fragmentation Chain Transfer) polymerization.

18. The method according to claim 1, wherein the first terminal structure comprises a block derived from vinylphosphoric acid.

19. The method according to claim 1, wherein the second terminal structure is a cyanoalkyl group.

20. The method according to claim 1, wherein the first monomer is a hydrocarbon group-substituted or unsubstituted styrene, the first terminal structure comprises a block derived from vinylphosphoric acid, and the second terminal structure is a cyanoalkyl group.

* * * * *